US007133285B2

(12) United States Patent
Nishimura (10) Patent No.: US 7,133,285 B2
(45) Date of Patent: Nov. 7, 2006

(54) ELECTRONICS CONNECTOR WITH HEAT SINK

(75) Inventor: Takeshi Nishimura, Santa Clara, CA (US)

(73) Assignee: Yamaichi Electronics U.S.A., Inc., San Jose, CA (US)

( * ) Notice: Subject to any disclaimer, the term of this patent is extended or adjusted under 35 U.S.C. 154(b) by 176 days.

(21) Appl. No.: 10/847,711

(22) Filed: May 18, 2004

(65) Prior Publication Data

US 2005/0162834 A1 Jul. 28, 2005

Related U.S. Application Data (60) Provisional application No. 60/538,970, filed on Jan. 23, 2004.

(51) Int. Cl.
*H05K 7/20* (2006.01)
*H01R 13/00* (2006.01)

(52) U.S. Cl. .............. 361/715; 361/704; 165/80.3; 165/185; 439/485; 439/487

(58) Field of Classification Search ........ 361/687–688, 361/704, 715, 719; 257/706, 718, 719, 722, 257/727; 165/80.3, 104.33, 185; 174/16.1, 174/16.3; 439/485, 487
See application file for complete search history.

(56) References Cited

U.S. PATENT DOCUMENTS

| | | | | |
|---|---|---|---|---|
| 4,471,837 A | * | 9/1984 | Larson | ............... 165/185 |
| 5,473,506 A | * | 12/1995 | Kikinis | ............... 361/688 |
| 5,475,563 A | * | 12/1995 | Donahoe et al. | ............ 361/695 |
| 5,793,609 A | * | 8/1998 | Donahoe et al. | ............ 361/695 |
| 5,796,584 A | * | 8/1998 | Myrberg | ............ 361/707 |
| 5,953,211 A | * | 9/1999 | Donahoe et al. | ............ 361/704 |
| 6,205,023 B1 | * | 3/2001 | Moribe et al. | ............... 361/704 |
| 6,278,609 B1 | * | 8/2001 | Suzuki et al. | ............... 361/704 |
| 6,418,024 B1 | * | 7/2002 | Edevold et al. | ............ 361/707 |
| 6,870,746 B1 | * | 3/2005 | Leeson et al. | ............. 361/816 |
| 6,942,506 B1 | * | 9/2005 | Kimura et al. | ............. 439/159 |
| 2004/0226689 A1 | * | 11/2004 | Thompson et al. | ........ 165/80.2 |
| 2005/0074995 A1 | * | 4/2005 | Kimura et al. | ............. 439/159 |
| 2005/0190540 A1 | * | 9/2005 | Shearman et al. | .......... 361/715 |

FOREIGN PATENT DOCUMENTS

JP   03188589 A   *   8/1991

\* cited by examiner

*Primary Examiner*—Lynn Feild
*Assistant Examiner*—Robert J. Hoffberg
(74) *Attorney, Agent, or Firm*—Squire, Sanders & Dempsey L.L.P.

(57) ABSTRACT

A heat sink includes a body and a heat transmitting member coupled thereto. The body and member are arranged such they each contact a different section of an electronic component, e.g., a PCMCIA card. The heat sink can be integrated into an electronic component connector that enables the heat sink to move parallel with the component during insertion and extraction. The connector can also enable vertical movement of the heat sink during component insertion and extraction.

53 Claims, 6 Drawing Sheets

ELECTRONICS CONNECTOR WITH HEAT SINK

PRIORITY REFERENCE TO PRIOR APPLICATIONS

This application claims benefit of and incorporates by reference patent application Ser. No. 60/538,970, entitled "PCMCIA Connector with Heat Sink," filed on Jan. 23, 2004, by inventor Takeshi Nishimura.

TECHNICAL FIELD

This invention relates generally to electronics connectors, and more particularly, but not exclusively, provides an electronics (e.g., PCMCIA card) connector with an integrated heat sink.

BACKGROUND

Figure 1A:
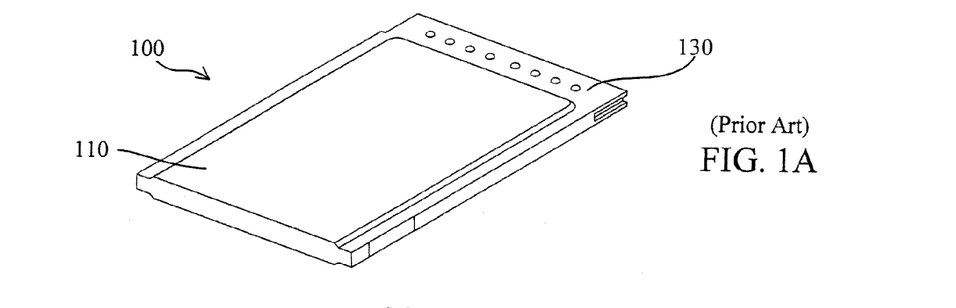
FIG. 1A and FIG. 1B are diagrams illustrating a conventional PCMCIA card.
Figure 1B:
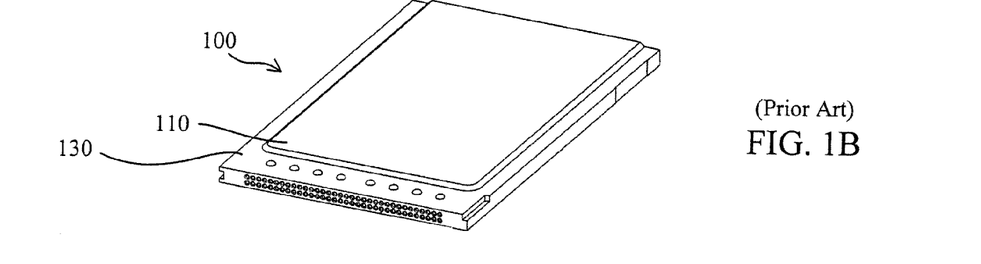

PCMCIA cards (also referred to as PC cards), such as a PCMCIA card 100 shown in FIG. 1A and FIG. 1B, are small credit card size devices originally intended for adding memory to portable computers. There are some different types of PCMCIA cards and most of these have the same width and length of 54 mm by 85.6 mm. However, the different types of PCMCIA cards can vary in thickness from 3.3 mm to 10.5 mm. In addition, PCMCIA cards may have a raised section, such as a raised section 110, which is a few mm thicker than a lowered section 130 of the card 100.

PCMCIA cards have evolved into peripheral devices for adding functionality to computers and other computing devices. For example, PCMCIA cards can include modems, wireless transceivers, LAN adapters and other devices. In addition, PCMCIA cards can provide decryption services to unlock channels or other features of a cable or satellite TV box.

However, a disadvantage of electronic components, such as PCMCIA cards, is that as they get more complex, their internal circuitry tend to generate a significant amount of heat, which must be dissipated to prevent damaging the component and adjacent equipment in the system. One conventional mechanism to dissipate the heat is to use a fan. However, fans can be noisy and relatively expensive.

A conventional solution to this problem is to use a heat sink. However, conventional heat sinks do not draw heat from all surfaces of PCMCIA cards. Further, heat sinks can damage PCMCIA cards during insertion/extraction from PCMCIA connectors due to scratching.

Accordingly, a new system is needed that dissipates heat without the noise and expense of a fan and without the drawbacks of conventional heat sinks.

SUMMARY

The present invention provides a heat sink and electronic component (e.g., a PCMCIA card) connector that overcomes the drawbacks mentioned above. The heat sink is designed to contact at least two surfaces of a PCMCIA card or other electronic device, thereby ensuring that heat from the PCMCIA card is better dissipated. Further, the heat sink can be movably coupled to the connector such that the heat sink moves horizontally in parallel with a PCMCIA card or other component during insertion/ejection. The heat sink can also move downwards and upwards during component insertion and ejection, respectively.

In an embodiment of the invention, the heat sink comprises a heat sink body and a heat transmitting member. The heat sink body is designed to contact a first section of a component. The heat transmitting member, which is coupled to the heat sink body, extends from the heat sink body to enable contact between the member and a second section of the component.

In an embodiment of the invention, the electronic component connector comprises a connector frame and the heat sink. The connector frame receives a component, such as a PCMCIA card. The heat sink is vertically and horizontally movably coupled to the connector frame such that insertion of a component into the connector frame causes the heat sink to move horizontally in parallel with the component and vertically downwards to contact the component.

An embodiment of the invention provides a method comprising: receiving an electronic component (e.g., a PCMCIA card) within a frame of a component connector; horizontally moving the heat sink in parallel with the component; and moving the heat sink downward until it contacts the component.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 9A-9C are diagrams illustrating cross sections of the PCMCIA connector in a card ejected position;

FIG. 10A-10C are diagrams illustrating cross sections of the PCMCIA connector in a card partially inserted position;

FIG. 11A-11D are diagrams illustrating cross sections of the PCMCIA connector when a card is further inserted; and FIG. 12A-12D are diagrams illustrating cross sections of the PCMCIA connector in a card fully inserted position.

DETAILED DESCRIPTION

The following description is provided to enable any person having ordinary skill in the art to make and use the invention, and is provided in the context of a particular application and its requirements. Various modifications to the embodiments will be readily apparent to those skilled in the art, and the principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 2:
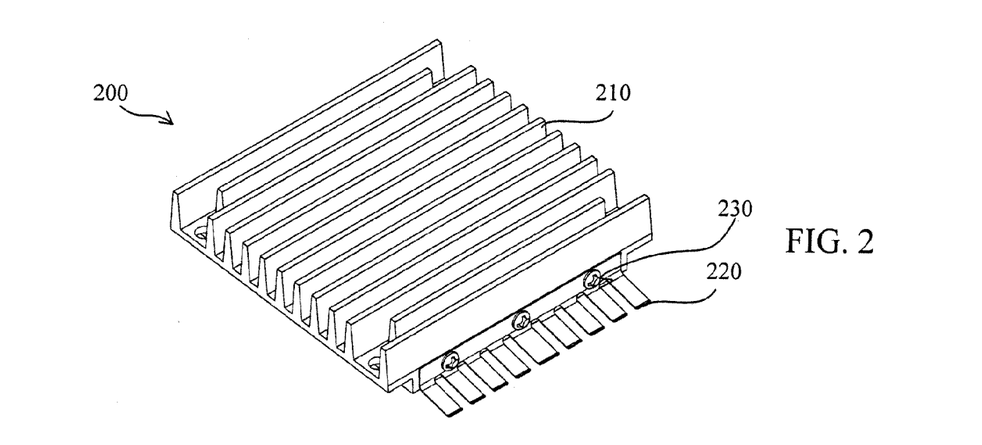
FIG. 2 is a diagram illustrating a heat sink according to an embodiment of the invention.

FIG. 2 is a diagram illustrating a heat sink 200 according to an embodiment of the invention. The heat sink 200 includes a heat sink body 210 with a heat transmitting member 220 coupled thereto via screws, such as a screw 230. The heat transmitting member 220 may be coupled to a side portion of the heat sink body 210 or to any other portion of the heat sink body 210 that is capable of receiving heat for dissipation. The heat sink 200 is used to cool the PCMCIA card 100 or other electronic component by absorbing heat from the PCMCIA card 100. It will be noted that while the invention is described in reference to the PCMCIA card 100, other electronic components can be used. The heat sink body 210 can include a plurality of fins to improve heat dissipation. The heat sink body 210 may be made of aluminum and also include a coating or thermal interface sheet of black oxide or other material to further improve heat dissipation.

The heat transmitting member 220 can comprise a single plate or a plurality of ribs for transmitting heat from the PCMCIA card 100 to the heat sink body 210. The heat transmitting member 220 can be made of aluminum or any other heat transmitting material. The heat transmitting member 220 is angled downwards from a horizontal plane of the heat sink body 210 so that the heat transmitting member 220 can come into contact with the lower section 130 of the PCMCIA card 100 as shown in FIG. 3.

In an embodiment of the invention, the heat sink body 210 has a width approximately equal to the PCMCIA card 100, i.e., about 54 mm, and a length slightly less than then length of the PCMCIA card 100, e.g., about 60 mm. The heat transmitting member 220 can have width equal to about the width of the PCMCIA card 100, i.e., about 54 mm, and a length of several mm, e.g., about 10 mm. Each rib of the heat transmitting member 220 can have a width of about 2 mm with a distance of 1 mm between adjacent ribs.

It will be appreciated by one of ordinary skill in the art the heat sink body 210 and heat transmitting member 220 can comprise different dimensions than those listed above. Further, other designs may be used in implementing the heat sink body 210 and heat transmitting member 220. In addition, additional members 220 can be coupled to the heat sink body 210 to contact other sections of the PCMCIA card 100 and/or other devices.

Figure 3:
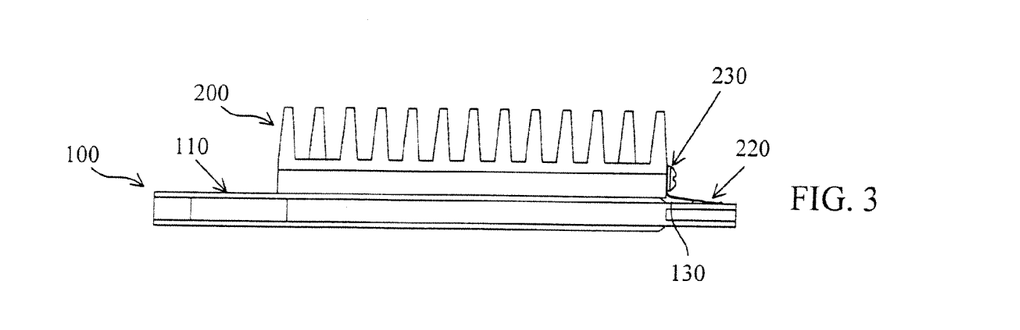
FIG. 3 is a diagram illustrating the heat sink contacting the PCMCIA card to dissipate heat.

FIG. 3 is a diagram illustrating the heat sink 200 contacting the PCMCIA card 100 to dissipate heat. When the PCMCIA card 100 is fully inserted into a PCMCIA connector 400 (FIG. 5A and FIG. 5B), a bottom surface of the heat sink body 210 comes into direct physical contact with a top surface of the raised section 110, thereby drawing heat from the raised section 110 of the PCMCIA card 100. The heat transmitting member 220 extends downwards a few mm to come into direct physical contact with the lowered section 130 of the PCMCIA card 100, thereby drawing heat from the lowered section 130 of the PCMCIA card 100.

Figure 4A:
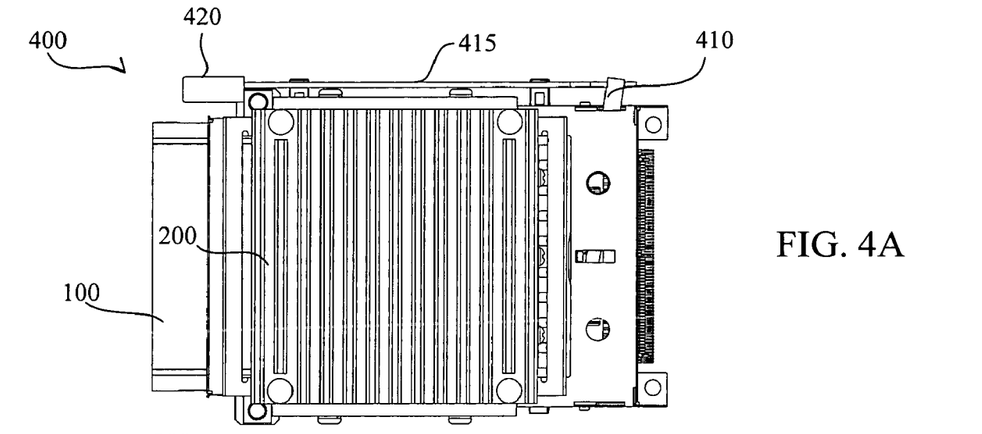
FIG. 4A and FIG. 4B are diagrams illustrating a PCMCIA connector with the heat sink integrated therein (in a card ejected position)
Figure 4B:
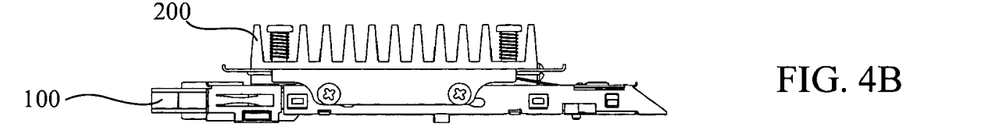

FIG. 4A and FIG. 4B are diagrams illustrating the PCMCIA connector 400 with the heat sink 200 integrated therein. The connector 400 includes an ejection lever 415 having an ejection button 420. The lever 415 is coupled at one end to a link 410 that pushes the PCMCIA card 100 to an unmated position when activated, as will be discussed in further detail below.

Figure 5A:
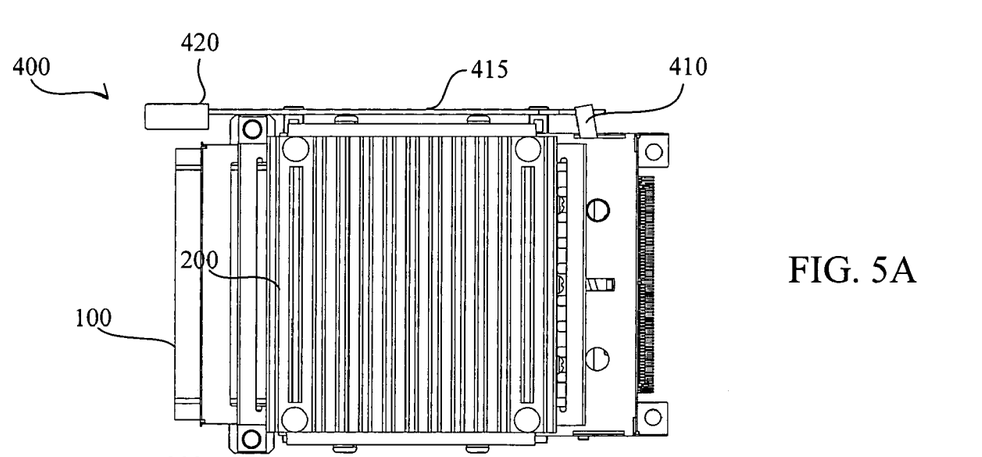
FIG. 5A and FIG. 5B are diagrams illustrating the PCMCIA connector with integrated heat sink in a card inserted position.
Figure 5B:
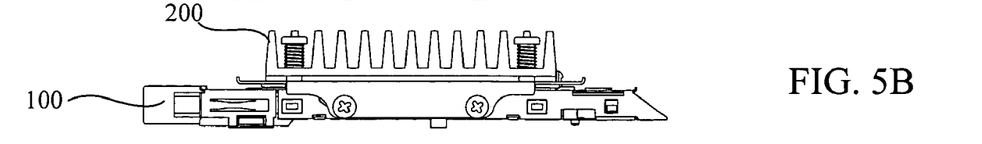

FIG. 5A and FIG. 5B are diagrams illustrating the PCMCIA connector 400 with integrated heat sink 200 in a card 100 inserted position. During card 100 insertion, as will be described in further detail below, the heat sink 200 moves both horizontally along the line of travel of the PCMCIA card 100 and also vertically downwards to contact the PCMCIA card 100. By moving the heat sink 200 both vertically and horizontally during card 100 insertion, scrapes on a top surface of the PCMCIA card 100 as well as degradation of any coatings or thermal sheets on a bottom surface of the heat sink body 210 and heat transmitting member 220 are avoided.

Figure 6:
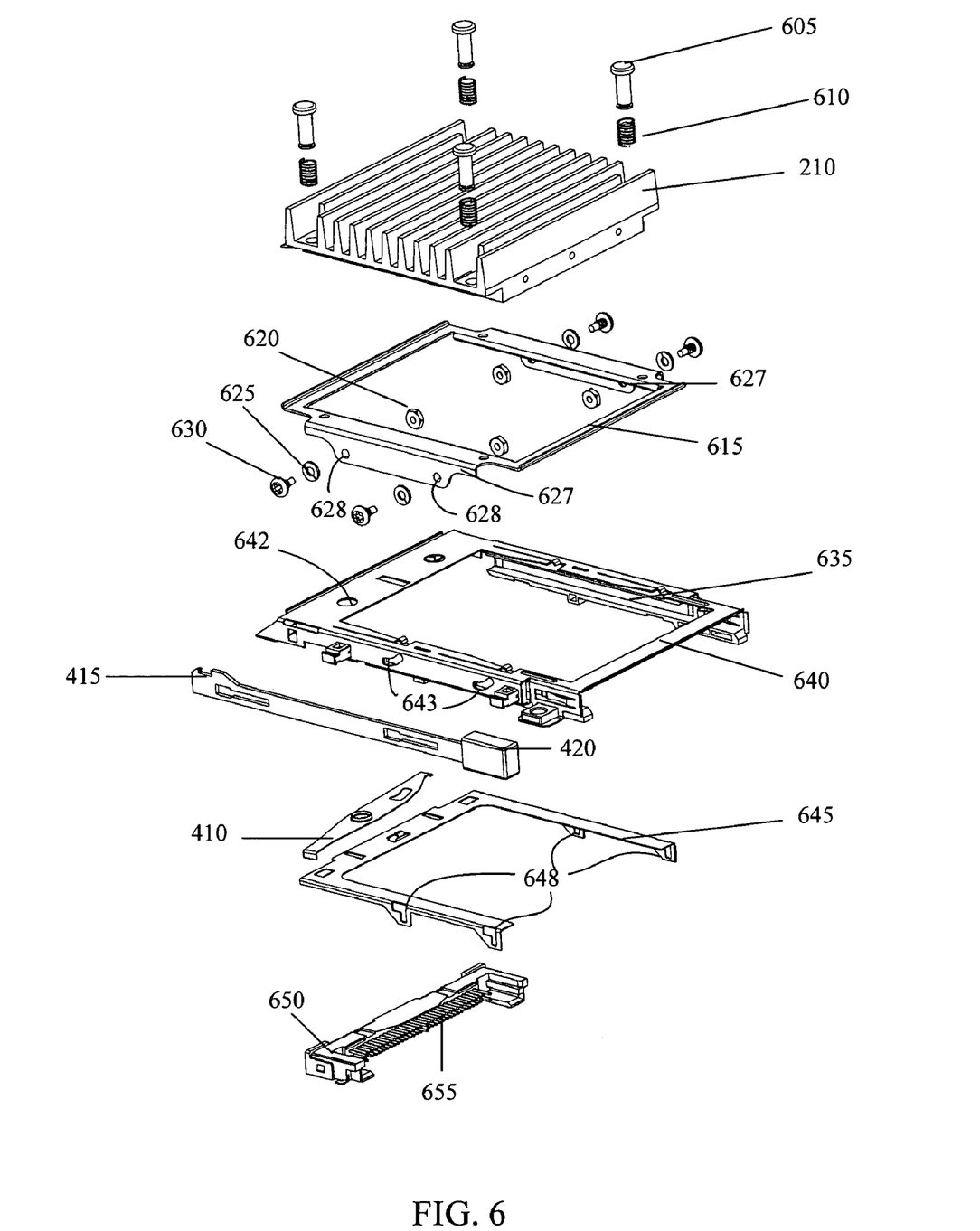
FIG. 6 is diagram illustrating the components of the PCMCIA connector with integrated heat sink.

FIG. 6 is diagram illustrating the components of guide rails 643 and 648 and frame 640 of the PCMCIA connector 400 with integrated heat sink 200. The heat sink body 210 includes four heat sink guideposts 605 that travel through four coil springs 610 and through heat sink body 210. The guideposts 605 couple heat sink frame 615 such that movement of the frame 615 moves the heat sink body 210 in synchronization.

The heat sink frame 615 generally has approximately the same dimensions of the heat sink body 210 and has an open interior space such that the bottom surface of the heat sink body 210 can come into direct contact with the top surface of the raised section 110 of the PCMCIA card 100. The heat sink frame 615 also includes two sidewalls 627, each having two openings 628 for shafts 630 to pass through. The shafts 630 are each secured to the heat sink frame 627 via a spring washer 625 and a nut 620. It will be appreciated by one of ordinary skill in the art that the shafts 630 can take any form or shape that is capable of alignment with the guard rails 643 and 648.

The heat sink frame 615 is movably coupled to a connector frame 640 that receives the PCMCIA card 100 and to an ejector 645 that ejects the PCMCIA card 100 to an unmated position from contact pins 655. Specifically, the shafts 630 are aligned with guard rails 643 and 648 on the connector frame 640 and ejector 645, respectively. The guard rails 643 are located in sidewalls of the connector frame 640 and are a few mm in length. The guard rails 643 have a sloping shape to enable gradual vertical movement of the heat sink 200. The guard rails 648 have a horizontally and vertically reversed L-shape and are used to move the heat sink 200, and to lock in place when the PCMCIA card 100 is ejected. Operation of the guard rails 643 and 648 will be discussed in further detail below.

The connector frame 640 also includes card guides 635 to guide the PCMCIA card 100 in a lateral direction within the connector frame 640. The card guides 635 are lateral grooves along the interior length of the connector frame 640 and have a thickness equal about at least the thickness of a PCMCIA card, e.g., about 3.3 mm.

The ejector 645, which is movably coupled to the connector frame 640 includes a link 410 that is pivotally coupled to the connector frame 640 at fulcrum 642 at an end the connector frame opposite a card insertion end of the connector frame 640. An ejector lever 415 is coupled to an end of the link 410 such that lateral movement of the lever 415 causes the link 410 to pivot, pushing the ejector 645 outwards, thereby pushing the PCMCIA card 100 partially out of the connector frame 640 where it can be fully extracted by a user.

An insulator body 650 is coupled to the connector frame 640 at an end opposite of a receiving end of the connector frame 640. The insulator body 650 includes contact pins 655 for connecting with the I/O port of the PCMCIA card 100. The contacts 655 can then feed data from and transmit data to the PCMCIA card 100 to/from the device in which the connector 400 is installed.

Figure 7:
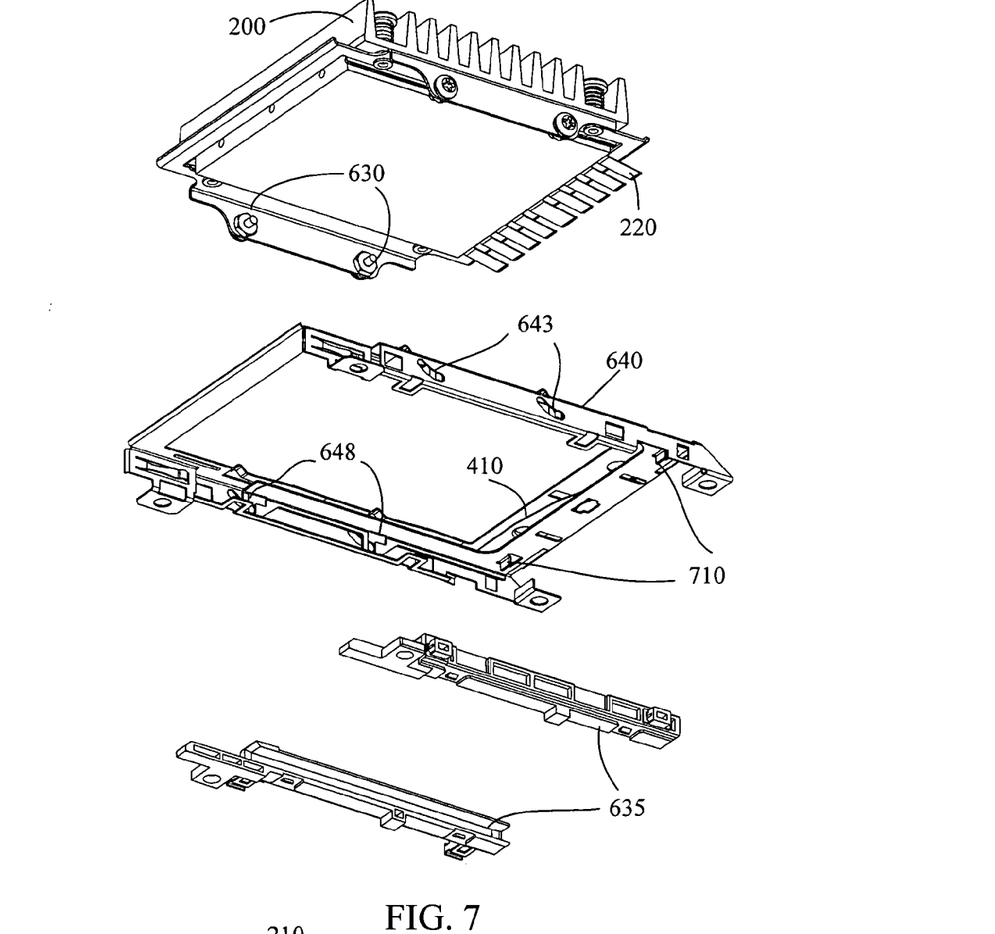
FIG. 7 is a diagram illustrating the components of guide rails and connector frame with integrated heat sink in partially assembled format.
Figure 8:
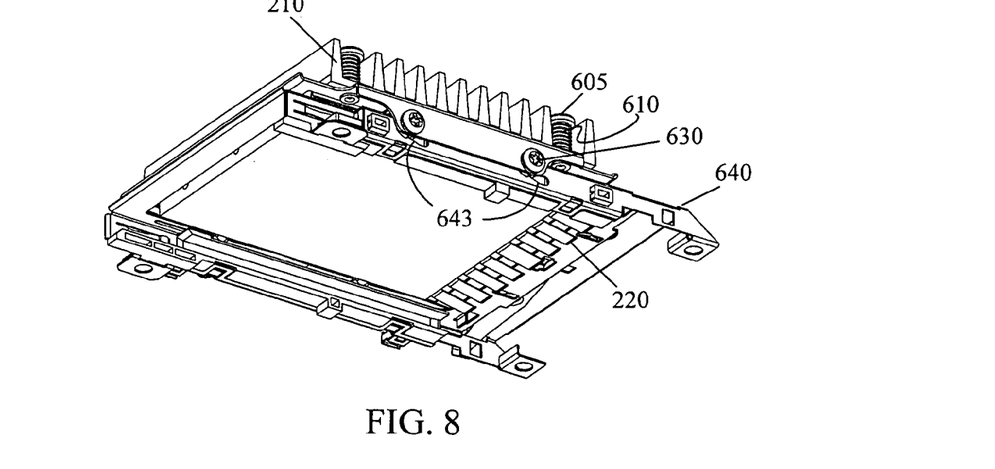
FIG. 8 is a diagram of the guide rails and connector frame with integrated heat sink in assembled format.

FIG. 7 is a diagram illustrating the components of the guard rail 643 and 648 and frame 640 of the PCMCIA connector 400 with integrated heat sink 200 in partially assembled format. The shafts 630 are placed into the guard rails 643 and 648 during assembly, thereby enabling limited vertical and horizontal movement of the heat sink 200 coupled to the connector frame 640.

Figure 9A:
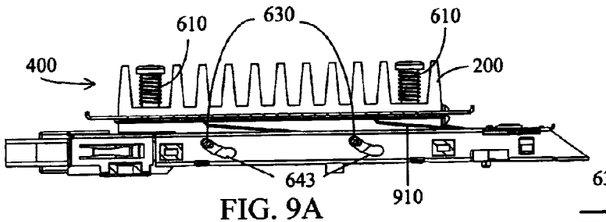
Figure 9B:
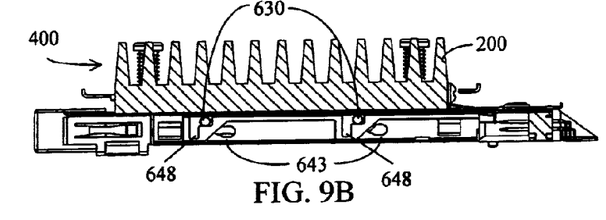
Figure 9C:
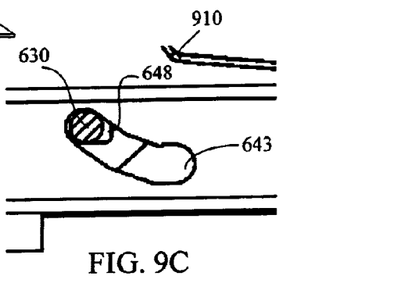

FIG. 9A-9C are diagrams illustrating cross sections of the PCMCIA connector 400 in a card 100 ejected position. The connector frame 640 includes levers or arms 910 on a top section of the connector frame 640. The levers or arms 910 provide upward bias against the heat sink 200, thereby enabling the heat sink 200 to be separated from the connector frame 640 to keep the slot open when a card 100 is not inserted.

When a card 100 is ejected, the shaft 630 is located in the leftmost section of the guard rail 643 and rightmost section of the guard rail 648. The guard rail 643 is shaped as a sectioned line with varying down slopes. A first section has a down slope of about 45° and a second section has a down slope of about 20°. By having varying down slopes, extra horizontal force is required to initially when inserting the card 100 into the frame 640 of the connector 400. However, once the shaft 630 reaches the second section, less horizontal force is requires due to the reduced down slope. Alternatively, the varying slopes can provide equal insertion force, wherein the second section provides less insertion force to compensate for increased insertion force from the levers or arms 910, coil springs 610 and contact pins 655.

The guard rail 648 is shaped like a horizontally and vertically reversed "L" and the horizontal area acts to lock the heat sink 200 to prevent moving down at a card ejected position.

Figures 10A, 10B, 10C:
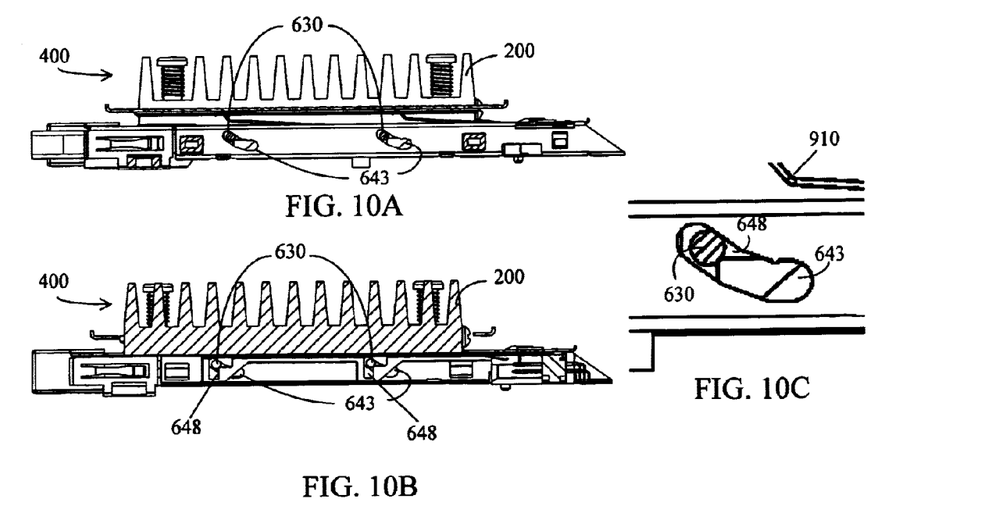
Figure 11A:
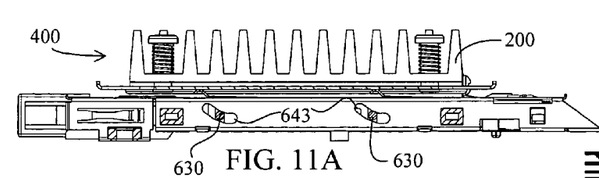
Figure 11B:
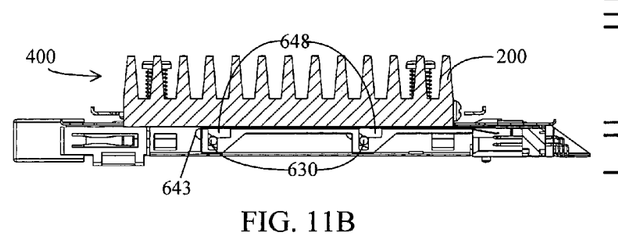
Figure 11C:
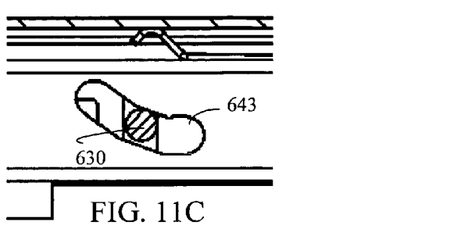
Figure 11D:
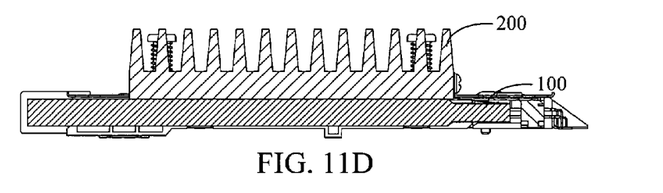
Figure 12A:
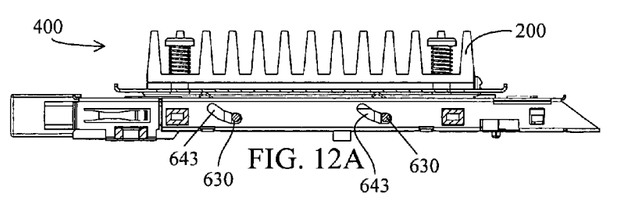
Figure 12B:
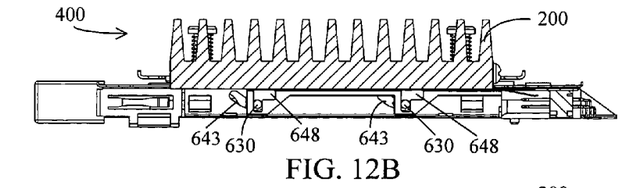
Figure 12C:
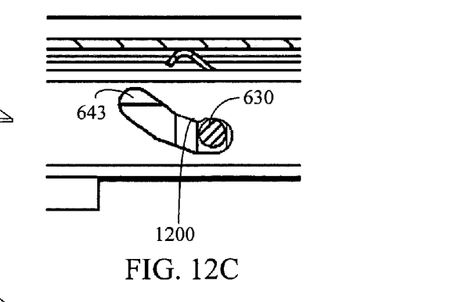
Figure 12D:
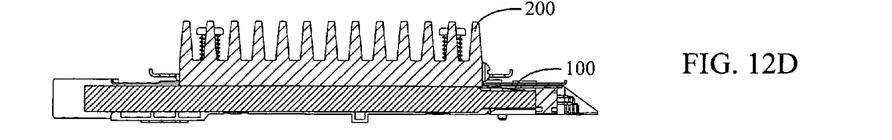

FIG. 10A-10C are diagrams illustrating cross sections of the PCMCIA connector 400 in a card 100 partially inserted position (e.g., about halfway). When the card 100 is inserted into the connector 400, it presses against knobs 710 (FIG. 7) of the ejector 645. In an embodiment of the invention, the ejector 645 includes two knobs 710 located on an inner top surface of the ejector 645 at end opposite at which the card 100 is inserted. It will be appreciated by one of ordinary skill in the art that the knobs 710 can be located at a plurality of different positions in the ejector 645.

Continuous pressing against the knobs 710 leads to pushing/sliding of the ejector 645 inwards in the connector 400, thereby causing the shaft 630 to move to the left side of the guard rail 648. Movement of the shaft 630 relative to the guard rail 643 is minimal, if any.

FIG. 11A-11D are diagrams illustrating cross sections of the PCMCIA connector 400 when a card 100 is further inserted (e.g., ¾ insertion). As the shaft 630, which is coupled to the heat sink 200 (via the heat sink frame 615), reaches the leftmost section of the guard rail 648, further insertion of the card 100 causes the heat sink 200 to move horizontally in parallel with the PCMCIA card and at the same speed as the PCMCIA card 100. In addition, as the guard rail 643 is sloped downward, the heat sink 200 also starts moving downward, compressing the coil springs 610 and the levers or arms 910. Even though the card 100 is not yet fully inserted, the heat sink 200 contacts the card 100.

FIG. 12A-12D are diagrams illustrating cross sections of the PCMCIA connector 400 in a card 100 fully inserted position. Further insertion of the PCMCIA card 100 pushes the shaft 630 down and around a slight protrusion 1200 near an end of a top sloping surface of the guard rail 643, which helps secure the PCMCIA card 100 in place and provides a user with a secure feeling. Further, as the shaft 630 is coupled to the heat sink 200 via the heat sink frame 615, the shaft 630 movement brings the heat sink 200 in physical contact with the PCMCIA card 100. Specifically, the heat sink body 210 contacts and compresses against the raised section 110 and the heat transmitting member 220 contacts the lowered section 130 of the PCMCIA card 100, thereby increasing heat dissipation compared to conventional heat sinks.

To eject the PCMCIA card 100, the ejection button 420 is pushed inwards, pushing the lever 415 inwards and activating the link 410, which rotates, pushing the ejector 645 outwards. Accordingly, the shaft 630 passes over the protrusion 1200 and heads upwards along the guard rail 643, thereby pushing the heat sink 200 upwards from the PCMCIA card 100.

Accordingly, the connector 400 prevents scratching and other damaging of the PCMCIA card 100 by enabling the heat sink 200 to move in parallel with the PCMCIA card 100 during insertion and extraction. Further, during the insertion, shaft 630 still keep to moving down after the heat sink 200 contacts the PCMCIA card 100, this motion provides enough contact force to the card 100 even if it has tolerance on its dimensions. In addition, the guard rails 643 comprise two separate downward sloped sections that can keep the insertion force relatively constant as an initial steep angle transfers into a shallow angle to compensate for the upward biased levers or arms 910, coil springs 605 and mating force of contact pins 655 or ease insertion after partial insertion. During ejection, the different sections and upward biased levers or arms 910 and coil springs 605 assist in ejection of the PCMCIA card 100.

The foregoing description of the illustrated embodiments of the present invention is by way of example only, and other variations and modifications of the above-described embodiments and methods are possible in light of the foregoing teaching. The embodiments described herein are not intended to be exhaustive or limiting. The present invention is limited only by the following claims.

What is claimed is:

1. An electronic component connector, comprising:
   a connector frame capable or receiving an electronic component;
   a heat sink unit vertically and horizontally movably coupled to the connector frame, such that insertion of the component into the connector frame causes the heat sink unit to move horizontally in parallel with the component and vertically to contact the component.

2. The connector of claim 1, wherein the heat sink unit comprises:
   a heat sink body to contact a first section of the computer component; and
   a heat transmitting member coupled to the heat sink body, the member extending from the heat sink body, thereby enabling contact between the member and a second section of the computer component.

3. The connector of claim 2, wherein the body comprises a plurality of fins.

4. The connector of claim 2, wherein the member comprises a plurality of ribs extending from the heat sink body.

5. The connector of claim 2, wherein the body includes a thermal interface sheet that improves heat dissipation.

6. The connector of claim 1, wherein the connector frame includes at least one arm biased against the heat sink unit.

7. The connector of claim 1, wherein the heat sink unit is movably coupled to the connector frame via guard rails which have a sloping shape slit, wherein shafts coupled to the heat sink unit travel within the guard rails.

8. The connector of claim 7, wherein the guard rails are coupled to the connector frame.

9. The connector of claim 7, wherein the sloping shape comprises at least two sections, the first section having a steeper slope than the second section.

10. The connector of claim 9, wherein the first section slope is approximately 45 degrees and the section slope is approximately 20 degrees.

11. The connector of claim 7, wherein sloping shape has an additional shaft recess section in the slit.

12. The connector of claim 11, wherein the shaft recess section has a protrusion in between the slope section.

13. The connector of claim 1, wherein the heat sink unit is movably coupled to the connector frame via two sets of guard rails, the first set having a vertical slit, the second set having a sloping shape slit, wherein shafts coupled to the heat sink unit travel within the guard rails.

14. The connector of claim 13, wherein the first set further includes a horizontal slit to form a horizontal and vertical L shape.

15. The connector of claim 14, wherein the horizontal slit prevents vertical movement of the shafts of the heat sink unit.

16. The connector of claim 13, wherein the first set of guard rails is coupled to an ejector.

17. The connector of claim 13, wherein the second set of guard rails is coupled to the connector frame.

18. The connector of claim 13, wherein the sloping shape comprises at least two sections, the first section having a steeper slope than the second section.

19. The connector of claim 18, wherein the first section slope is approximately 45 degrees and the section slope is approximately 20 degrees.

20. The connector of claim 13, wherein the sloping shape slit on the second set of guard rails has an additional shaft recess section in the slit.

21. The connector of claim 20, wherein the shaft recess section has a protrusion in between the slope sections.

22. The connector of claim 1, wherein the connector enables further compression of the heat sink unit against the component after initial contact between the component and the heat sink unit during insertion.

23. The connector of claim 22, wherein the heat sink unit comprises a heat sink body, a heat sink frame and springs; the heat sink body is assembled movably to the frame with the springs.

24. The connector of claim 7 or 13, wherein the connector enables further compression of the heat sink unit against the component after initial contact between the component and the heat sink unit during insertion.

25. The connector of claim 24, wherein the heat sink unit comprises a heat sink body, a heat sink frame, springs and shafts; the heat sink body is assembled movably to the frame with the springs, and the shafts which are inserted into the guard rails protrude from the heat sink frame.

26. The connector of claim 1, wherein the insertion of the component into the connector frame causes the heat sink unit to move horizontally in the direction of the component's movement.

27. The connector of claim 1, wherein there is no relative horizontal movement between the component and the heat sink unit after initial contact between the component and the heat sink unit during insertion.

28. A method, comprising:
receiving an electronic component within a frame of a system component connector;
using an ejector to horizontally move a heat sink unit in parallel with the component; and
using guard rails to move the heat sink unit vertically to contacts the component.

29. The method of claim 28, wherein the heat sink unit comprises:
a heat sink body to contact a first section of the computer component; and
a heat transmitting member coupled to the heat sink body, the member extending from the heat sink body, thereby enabling contact between the member and a second section of the computer component.

30. The method of claim 29, wherein the body comprises a plurality of fins.

31. The method of claim 29, wherein the member comprises a plurality of ribs extending from the heat sink body.

32. The method of claim 29, wherein the body includes a thermal interface sheet that improves heat dissipation.

33. The method of claim 28, wherein the connector frame includes at least one arm biased against the heat sink unit.

34. The method of claim 28, wherein the heat sink unit is movably coupled to the connector frame via guard rails which have sloping shape slit, wherein shafts coupled to the heat sink unit travel within the guard rails.

35. The method of claim 34, wherein the guard rails are coupled to the connector frame.

36. The method of claim 34, wherein the sloping shape comprises at least two sections, the first section having a steeper slope than the second section.

37. The method of claim 36, wherein the first section slope is approximately 45 degrees and the section slope is approximately 20 degrees.

38. The method of claim 34, wherein sloping shape have additional shaft recess section in the slit.

39. The method of claim 38, wherein the shaft recess section has a protrusion in between the slope section.

40. The method of claim 28, wherein the heat sink unit is movably coupled to the connector frame via two sets of guard rails, the first set having a vertical slit, the second set having a sloping shape slit, wherein shafts coupled to the heat sink unit travel within the guard rails.

41. The method of claim 40, wherein the first set further includes a horizontal slit to form a horizontal and vertical L shape.

42. The method of claim 41, wherein the horizontal slit prevents vertical movement of the shafts of the heat sink unit.

43. The method of claim 40, wherein the first set of guard rails is coupled to an ejector.

44. The method of claim 40, wherein the second set of guard rails is coupled to a connector frame.

45. The method of claim 40, wherein the sloping shape comprises at least two sections, the first section having a steeper slope than the second section.

46. The method of claim 45, wherein the first section slope is approximately 45 degrees and the section slope is approximately 20 degrees.

47. The method of claim 40, wherein sloping shape slit on the second set of guard rails have additional shaft recess section in the slit.

48. The method of claim 47, wherein the shaft recess section having a protrusion in between the slope section.

49. The method of claim 28, further comprising
using an ejector to expel the component from the connector frame;
using the ejector to horizontally move the heat sink unit in parallel with the component; and using the guard rails to move the heat sink unit vertically so that it no longer contacts the component.

50. The method of claim 28, 34 or 40, wherein the connector enables further compression of the heat sink unit against the component after initial contact between the component and the heat sink unit during insertion.

51. The method of claim 50, wherein the heat sink unit comprises heat sink body, heat sink frame, springs, and shafts; the heat sink body is assembled movably between the heat sink frame with springs, and the shafts which inserted to the guard rail protrude from the heat sink frame.

52. The method of claim 28, wherein the insertion of the component into the connector frame causes the heat sink unit to move horizontally in the direction of the component's movement.

53. The method of claim 28, wherein there is no relative horizontal movement between the component and the heat sink unit after initial contact between the component and the heat sink unit during insertion.

* * * * *